(12) United States Patent
Cho et al.

(10) Patent No.: US 7,808,817 B2
(45) Date of Patent: Oct. 5, 2010

(54) NONVOLATILE MEMORY DEVICE USING RESISTIVE ELEMENTS AND AN ASSOCIATED DRIVING METHOD

(75) Inventors: Beak-Hyung Cho, Hwaseong-si (KR); Byung-Gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 12/186,649

(22) Filed: Aug. 6, 2008

(65) Prior Publication Data
US 2009/0040819 A1 Feb. 12, 2009

(30) Foreign Application Priority Data
Aug. 10, 2007 (KR) .................. 10-2007-0080680

(51) Int. Cl.
*G11C 11/00* (2006.01)
(52) U.S. Cl. .................. 365/163; 365/148
(58) Field of Classification Search .................. 365/163, 365/148, 100
See application file for complete search history.

(56) References Cited
U.S. PATENT DOCUMENTS
7,227,776 B2 * 6/2007 Cho et al. .................. 365/163
7,423,898 B2 * 9/2008 Tanizaki et al. ............. 365/148
7,453,722 B2 * 11/2008 Choi et al. .................. 365/163

FOREIGN PATENT DOCUMENTS
| JP | 2006079756 A | 3/2006 |
|---|---|---|
| KR | 1020060102682 A | 9/2006 |
| KR | 1020060133740 A | 12/2006 |

* cited by examiner

*Primary Examiner*—Anh Phung
(74) *Attorney, Agent, or Firm*—Volentine & Whitt, PLLC

(57) ABSTRACT

A nonvolatile memory device is configured to increase the reliability of a write operation by providing a sufficiently high write current while reducing current consumption in a read operation. The nonvolatile memory device includes a memory cell array having a plurality of nonvolatile memory cells. A global bit line and a local bit line coupled to a plurality of the nonvolatile memory cells. The local bit line has first and second nodes. First and second bit line selection circuits are included where the first bit line selection circuit is coupled to the first node of the local bit line and the second bit line selection circuit is coupled to the second node of the local bit line. The first and second bit line selection circuits operate during a first period to electrically connect the local bit line to the global bit line, and only one of the first and second bit line selection circuits operates during a second period to electrically connect the local bit line to the global bit line.

20 Claims, 14 Drawing Sheets

NONVOLATILE MEMORY DEVICE USING RESISTIVE ELEMENTS AND AN ASSOCIATED DRIVING METHOD

CROSS-REFERENCE TO RELATED APPLICATION

This application claims the benefit of Korean Patent Application No. 10-2007-0080680 filed on Aug. 10, 2007 in the Korean Intellectual Property Office, the disclosure of which is incorporated herein by reference in its entirety

BACKGROUND OF THE INVENTION

1. Field of the invention

The present invention relates generally to nonvolatile memory devices using resistive elements and an associated driving method.

2. Discussion of Related Art

Next generation nonvolatile memory devices are being developed for use in portable consumer products to provide high capacity and low power consumption. While dynamic RAM (DRAM) and flash memory devices store data by using charge, nonvolatile memory devices utilize resistance material to store data by changing the state of phase-change material. These memory devices include, for example, PRAMs (Phase change Random Access Memory) utilizing phase-change material such as a chalcogenide alloy that can be switched between two states, RRAMs (Resistance Random Access Memory) employing material having a variable resistance characteristic of complex metal oxides, and MRAMs (Magnetic Random Access Memory) utilizing the resistance change of MTJ (Magnetic Tunnel Junction) thin films according to the magnetization state of a ferromagnetic substance. The resistance value is maintained in these devices even when no current or voltage is supplied demonstrating nonvolatile memory characteristics.

In a phase-change memory cell, when the material is heated and then cooled, the phase-change material transforms into a crystalline state or an amorphous state. The material has a low resistance in the crystalline state and a high resistance in the amorphous state. The crystalline state may be defined as data "set" or data "0," and the amorphous state may be defined as data "reset" or data "1." In order to write data on the phase-change memory cell, the state of the phase-change material must be changed by a sufficiently high write current. In order to read data from the phase-change memory cell, a read current (or sensing current) smaller than the write current must be provided to maintain the state of the phase-change material.

SUMMARY OF THE INVENTION

Exemplary embodiments of the present invention are directed to a nonvolatile memory device configured to increase the reliability of a write operation by providing a sufficiently high write current while reducing current consumption in a read operation. In an exemplary embodiment, the nonvolatile memory device includes a memory cell array having a plurality of nonvolatile memory cells. A bit line defined by a global bit line and a local bit line is coupled to a plurality of the nonvolatile memory cells having first and second nodes. In addition, first and second bit line selection circuits are included where the first bit line selection circuit is coupled to the first node of the local bit line and the second bit line selection circuit is coupled to the second node of the local bit line. The first and second bit line selection circuits operate during a first period to electrically connect the local bit line to the global bit line, and only one of the first and second bit line selection circuits operates during a second period to electrically connect the local bit line to the global bit line.

BRIEF DESCRIPTION OF THE DRAWINGS

FIG. 9A to 9B are diagrams illustrating a writing method of the nonvolatile memory device according to an exemplary embodiment of the present invention.

DESCRIPTION OF EMBODIMENTS

Figure 1:
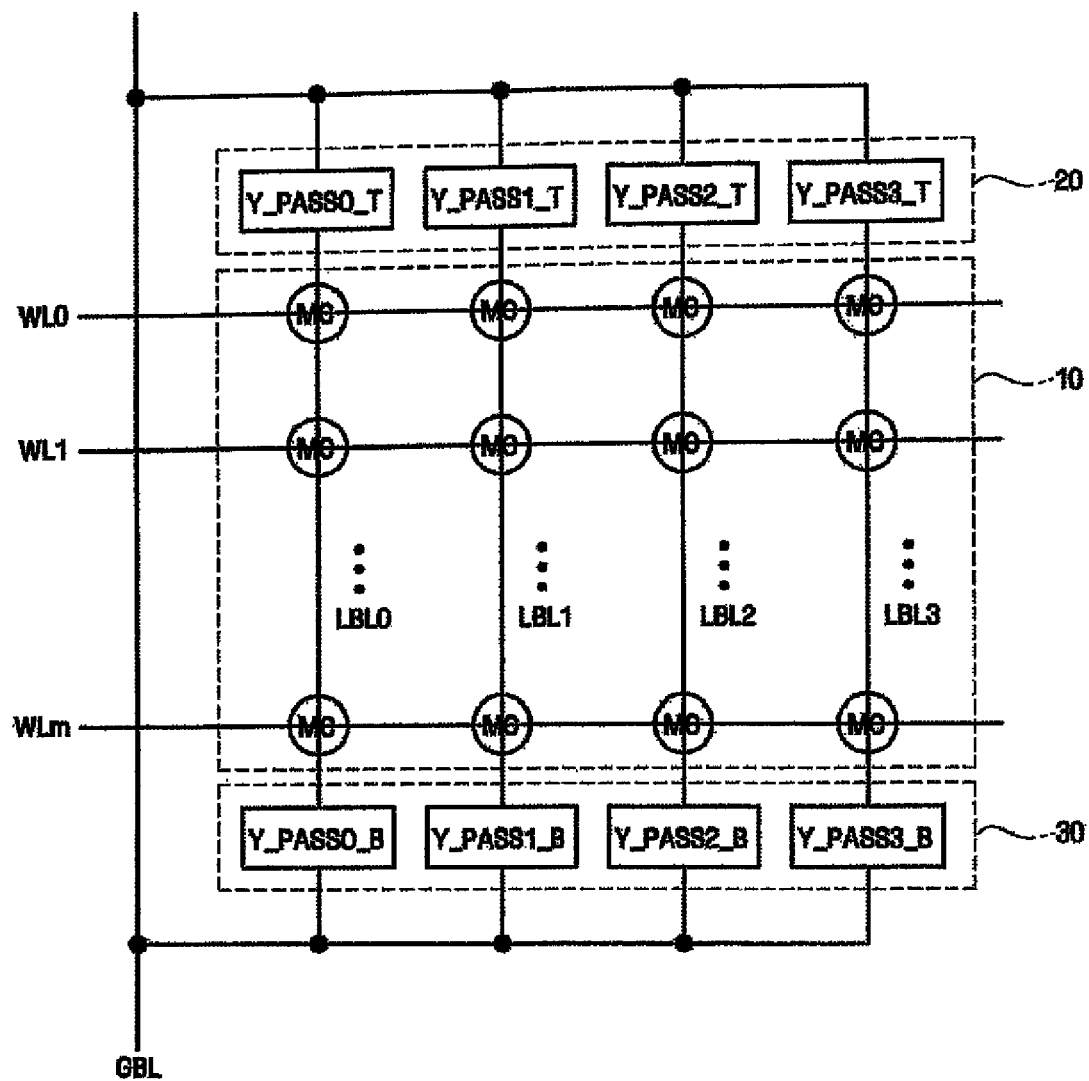
FIG. 1 is a block diagram illustrating the configuration of a nonvolatile memory device according to exemplary embodiments of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Spatially relative terms, such as "beneath", "below", "lower", "above", "upper" and the like, may be used herein for ease of description to describe one element or the relationship to another element(s) or feature(s) as illustrated in the figures. It will be understood that the spatially relative terms may be intended to encompass different orientations of the device in use or operation in addition to the orientation depicted in the figures.

Figure 2:
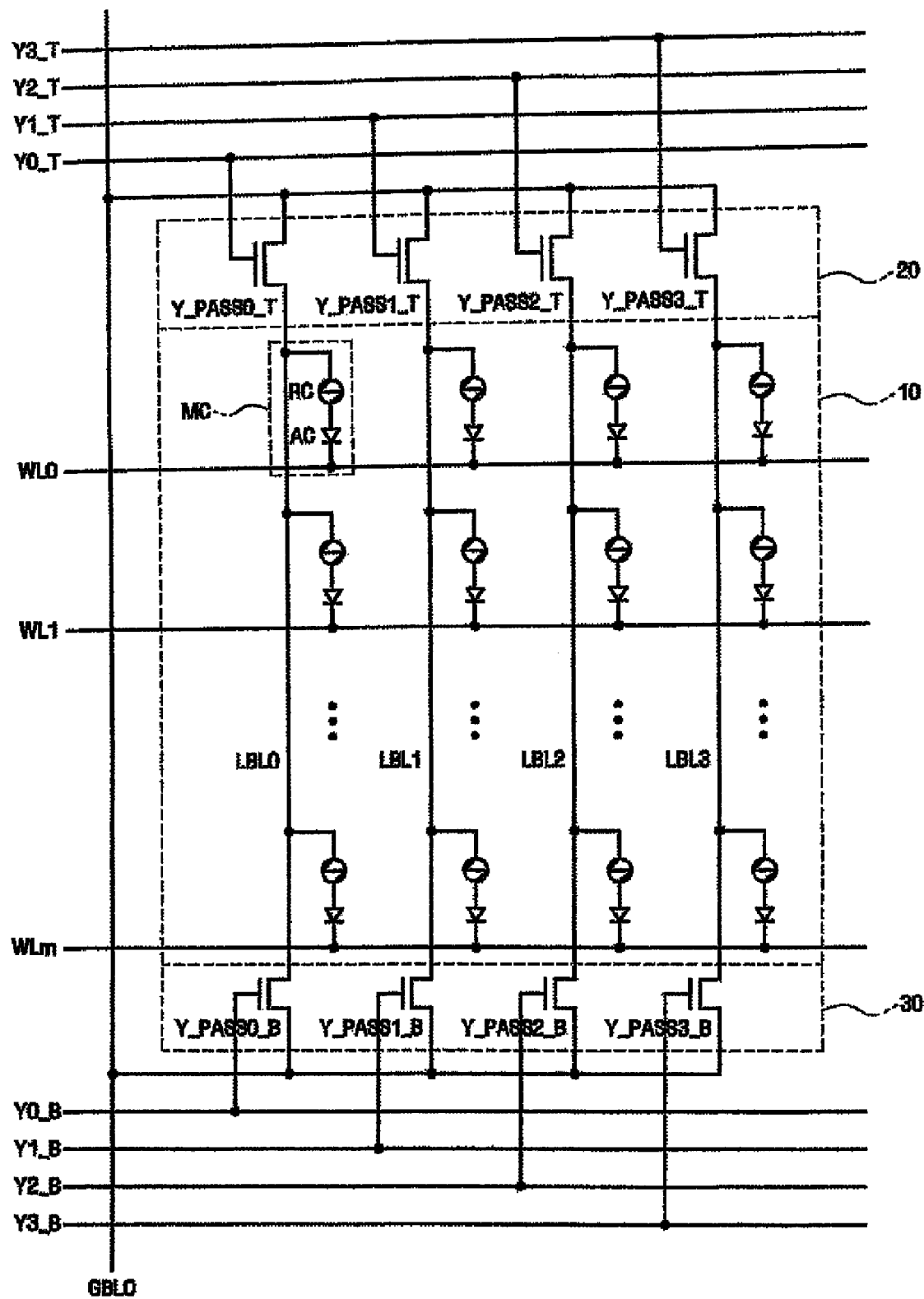
FIG. 2 is an exemplary circuit diagram of FIG. 1.

FIG. 1 is a block diagram illustrating a nonvolatile memory device and FIG. 2 is an exemplary circuit diagram of the memory device of FIG. 1. The nonvolatile memory device includes memory cell array 10, word lines WL0-WLm, local bit lines LBL0-LBL3, global bit line GBL, first bit line selection block 20, and second bit line selection block 30. Memory cell array 10 includes a matrix of nonvolatile memory cells (MC) coupled among word lines WL0-WLm and bit lines LBL0 to LBL3. Each nonvolatile memory cell (MC) comprises a variable resistive element "RC" including a phase-change material having a different resistance value depending on whether it is in a crystalline state or an amorphous state and an access element "AC" for controlling current flowing through variable resistive element "RC." Access element "AC" may include a diode, a transistor, etc., serially coupled with variable resistance element RC. Although FIG. 2 illustrates a diode as an example of the variable resistance element RC, alternative resistive elements may also be employed. Various types of phase-change material may include a binary (two-element) compound such as GaSb, InSb, InSe, Sb2Te3 and GeTe, a ternary (three-element) compound such as GeSbTe, GaSeTe, InSbTe, SnSb2Te4, and InSbGe, and a quaternary (four-element) compound such as AgInSbTe, (GeSn)SbTe, GeSb(SeTe), and Te81Ge15Sb2S2. The most commonly used phase-change material is GeSbTe which is a compound of germanium (Ge), antimony (Sb), and tellurium (Te).

First bit line selection block 20 is disposed at an upper side of memory cell array 10. Second bit line selection block 30 is disposed at a lower side of memory cell array 10. First bit line selection block 20 includes first bit line selection circuits Y_PASS0_T to Y_PASS3_T coupled between local bit lines LBL0 to LBL3 and global bit line GBL, respectively. First bit line selection circuits Y_PASS0_T to Y_PASS3_T may be implemented, for example, by NMOS transistors which are turned on in response to first column selection signals Y0_T to Y3_T, respectively. Similarly, second bit line selection block 30 includes second bit line selection circuits Y_PASS0_B to Y_PASS3_B coupled between local bit lines LBL0 to LBL3 and global bit line GBL, respectively. Second bit line selection circuits Y_PASS0_B to Y_PASS3_B may be implemented, for example, by NMOS transistors which are turned on in response to second column selection signals Y0_B to Y3_B, respectively. The driving method of the first bit line selection circuits Y_PASS0_T to Y_PASS3_T and the second bit line selection circuits Y_PASS0_B to Y_PASS3_B changes depending on the operation mode. For example, the driving method of first bit line selection circuits Y_PASS0_T to Y_PASS3_T and the second bit line selection circuits Y_PASS0_B to Y_PASS3_B in a write operation may be different from the driving method of the first bit line selection circuits Y_PASS0_T to Y_PASS3_T and the second bit line selection circuits Y_PASS0_B to Y_PASS3_B in a read operation.

Figure 3:
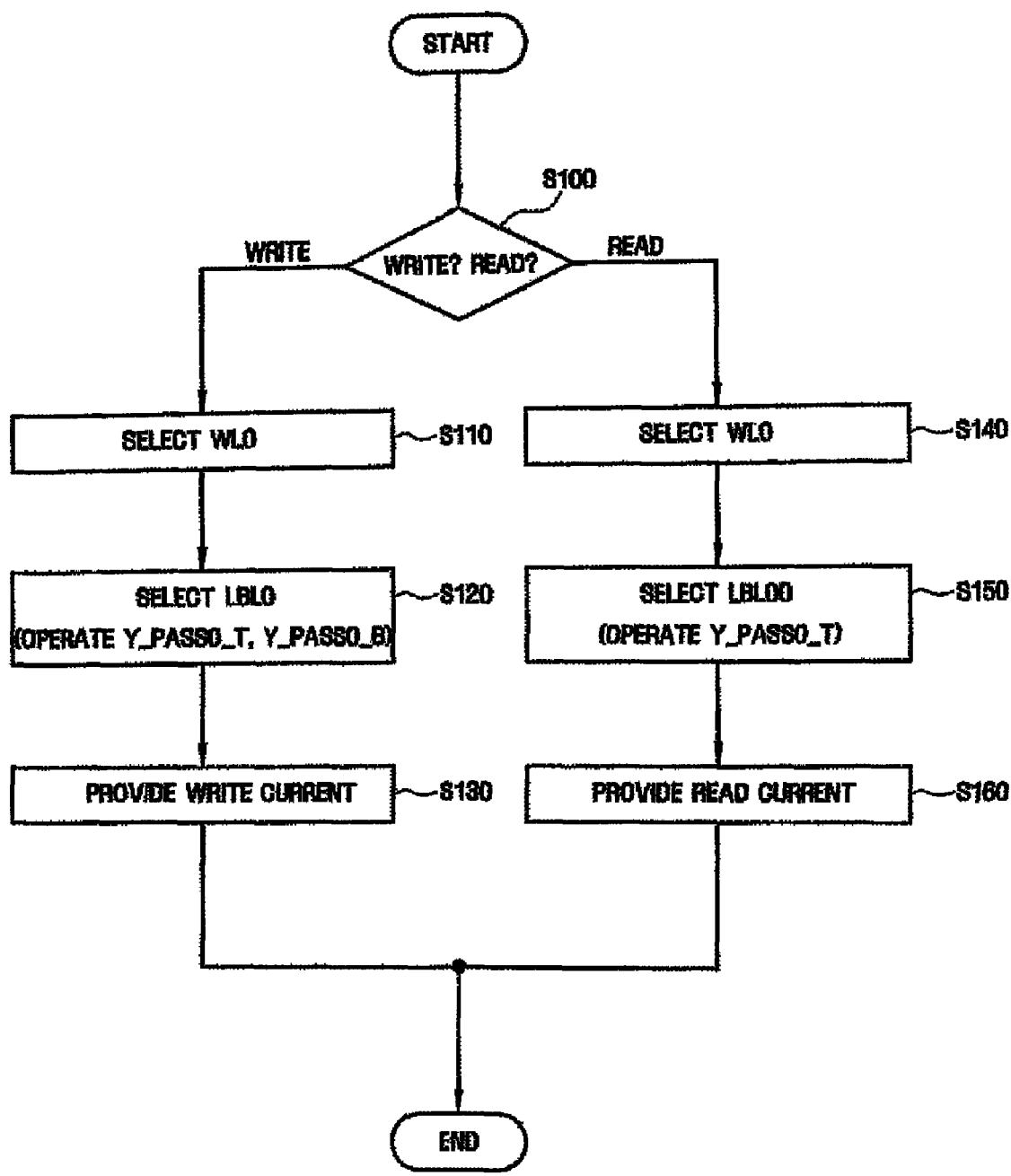
FIG. 3 is a flowchart illustrating a driving method of the nonvolatile memory device according to exemplary embodiments of the present invention.

FIG. 3 is a flowchart illustrating a driving method as an example of writing and reading data to a nonvolatile memory cell MC. First at step 100, a determination is made whether a read operation or a write operation is to be performed. If a write operation is to be performed, the word line WL0 is selected at step 110. First and second bit line selection circuits Y_PASS0_T and Y_PASS0_B coupled with the local bit line LBL0 operate to form an electrical connection between local bit line LBL0 and global bit line GBL at step 120. A write current is provided to write data to the nonvolatile memory cell MC coupled with word line WL0 and local bit line LBL0 at step 130. In this example, there are two paths for the write current. One current path is defined from a write circuit (not shown) to global bit line GBL to first bit line selection circuit Y_PASS0_T to local bit line LBL0 to word line WL0. Another current path is defined from a write circuit (not shown) to global bit line GBL to second bit line selection circuit Y_PASS0_B to local bit line LBL0 to word line WL0. When both first bit line selection circuit Y_PASS0_T and second bit line selection circuit Y_PASS0_B operate, the amount of current reaching nonvolatile memory cell MC increases, thereby supplying a sufficient write current to nonvolatile memory cell MC. In this manner, the reliability of the write operation is increased. Alternatively, there may be "N" (where N is a natural number) current paths for a write current to flow to a nonvolatile memory cell MC selected by a write circuit, and M current paths for a read current to flow to a nonvolatile memory cell "MC" selected by a read circuit where M is a natural number less than N.

If a read operation is to be performed, word line WL0 is selected at step 140. Only one (e.g. Y_PASS0_T) of the first and second bit line selection circuits Y_PASS0_T and Y_PASS0_B coupled with local bit line LBL0 operates such that an electrical connection is formed between local bit line LBL0 and global bit line GBL at step 150. At step 160, a read current is provided to read data from the particular nonvolatile memory cell MC coupled with word line WL0 and local bit line LBL0. Only one current path for the read current is generated which is defined from a read circuit (not shown) to global bit line GBL to first bit line selection circuit Y_PASS0_T to local bit line LBL0 to word line WL0. Since the read current does not change the state of the phase-change material, the read current has a smaller magnitude than the write current. Although either of the first and second bit line selection circuits Y_PASS0_T and Y_PASS0_B operate, current required for the read operation can be sufficiently provided to the nonvolatile memory cell "MC." In addition, since only one bit line selection circuit operates, the current consumed to operate the bit line selection circuit is reduced during the read operation.

Figure 4:
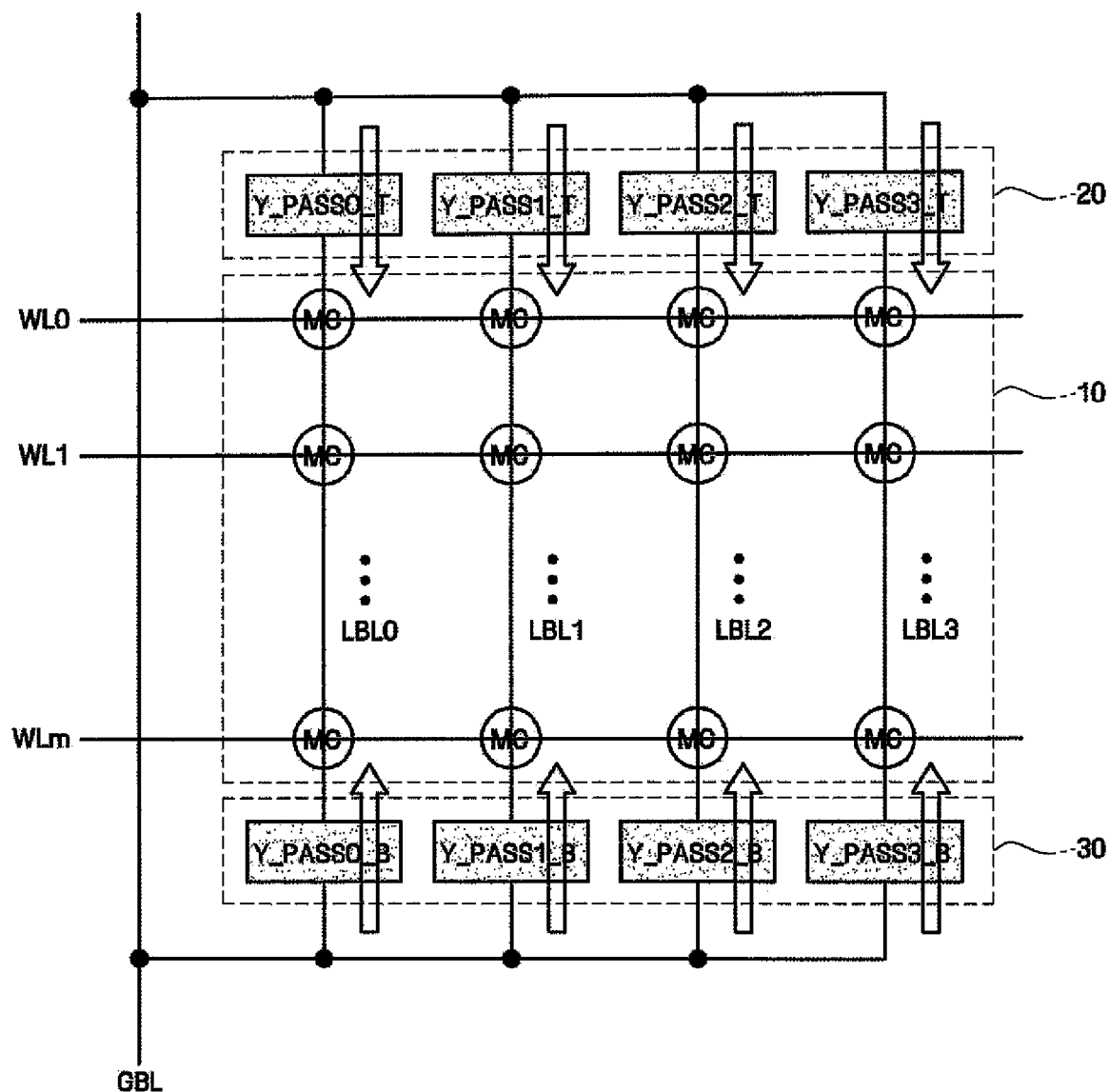
FIG. 4 is a diagram illustrating a writing method of the nonvolatile memory device according to exemplary embodiments of the present invention.

Referring to FIGS. 4, and 5A-7B, the operation of the first bit line selection circuits Y_PASS0_T to Y_PASS3_T and the second bit line selection circuits Y_PASS0_B to Y_PASS3_B for a write and read operation is described. As shown in FIG. 4, the first and second bit line selection circuits Y_PASS0_T to Y_PASS3_T and Y_PASS0_B to Y_PASS3_B coupled with the local bit lines LBL0 to LBL3 are selected for a write operation. For example, first and second bit line selection circuits Y_PASS0_T and Y_PASS0_B both operate when local bit line LBL0 is selected. First and second bit line selection circuits Y_PASS1_T and Y_PASS1_B both operate when local bit line LBL1 is selected. First and second bit line selection circuits Y_PASS2_T and Y_PASS2_B both operate when local bit line LBL2 is selected. First and second bit line selection circuits Y_PASS3_T and Y_PASS3_B both operate when local bit line LBL3 is selected.

During a read operation, any one of the first and second bit line selection circuits Y_PASS0_T to Y_PASS3_T and Y_PASS0_B to Y_PASS3_B coupled with local bit lines LBL0 to LBL3 are selected. In particular, only certain bit line selection circuits in bit line selection blocks 20 and 30 operate while the other bit line selection circuits do not operate as shown in FIGS. 5A-6B. For example, second bit line selection circuit Y_PASS0_B operates when local bit line LBL0 is selected. First bit line selection circuit Y_PASS1_T operates when local bit line LBL1 is selected. Second bit line selection circuit Y_PASS2_B operates when local bit line LBL2 is selected. First bit line selection circuit Y_PASS3_T operates when local bit line LBL3 is selected.

First bit line selection circuits Y_PASS1_T and Y_PASS3_T and second bit line selection circuits Y_PASS0_B and Y_PASS2_B both operate upon a write and a read operation while first bit line selection circuits Y_PASS0_T and Y_PASS2_T and second bit line selection circuits Y_PASS1_B and Y_PASS3_B operate only upon a write operation. Bit line selection circuits Y_PASS0_T, Y_PASS2_T, Y_PASS1_B, and Y_PASS3_B operate only upon a write operation and may be disposed on at least one side of bit line selection circuits Y_PASS1_T, Y_PASS3_T, Y_PASS0_B, and Y_PASS2_B which both operate upon a write and a read operation.

Figure 5A:
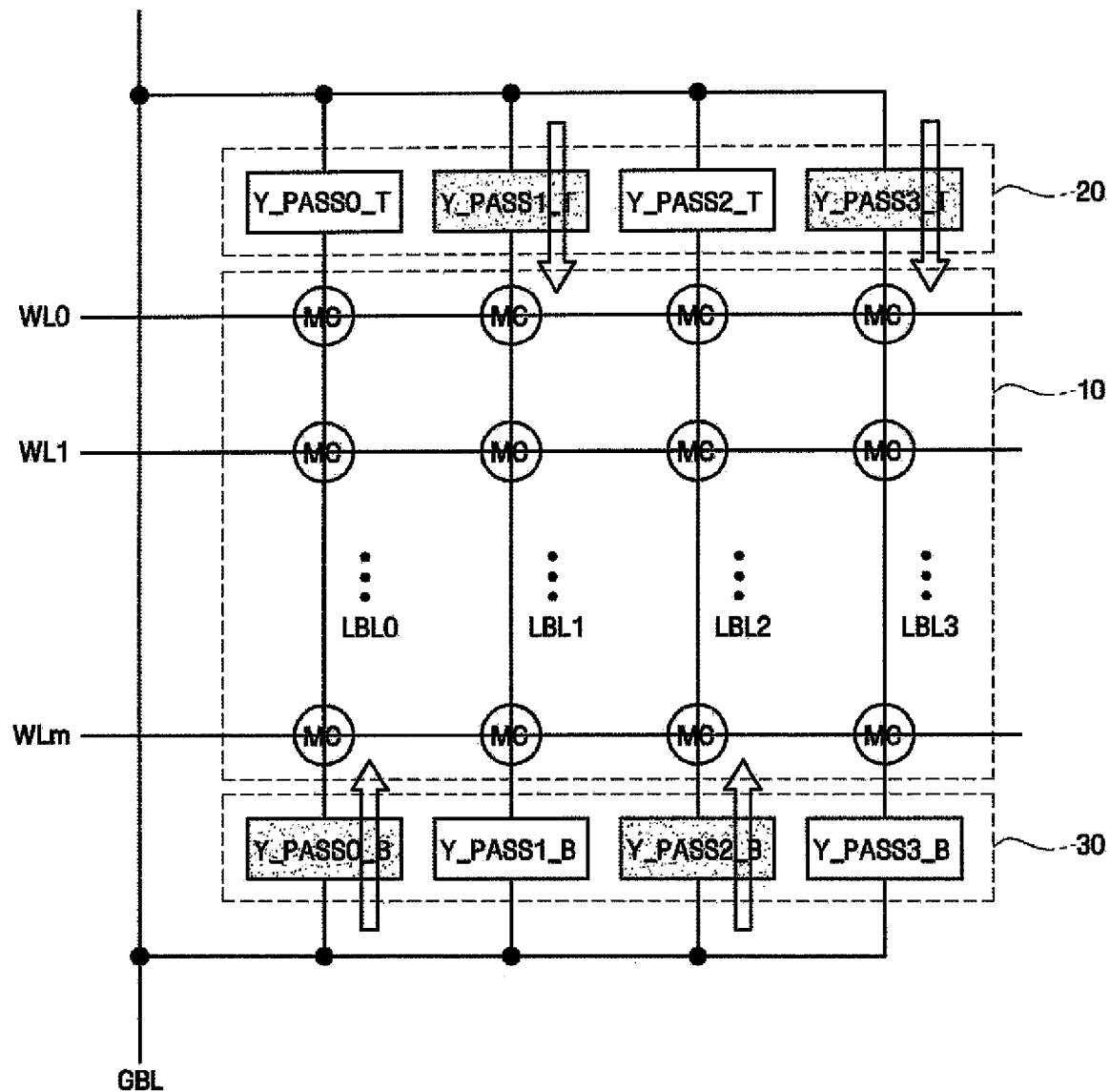
FIG. 5A to 7B are diagrams illustrating a reading method of the nonvolatile memory device according to exemplary embodiments of the present invention.
Figure 5B:
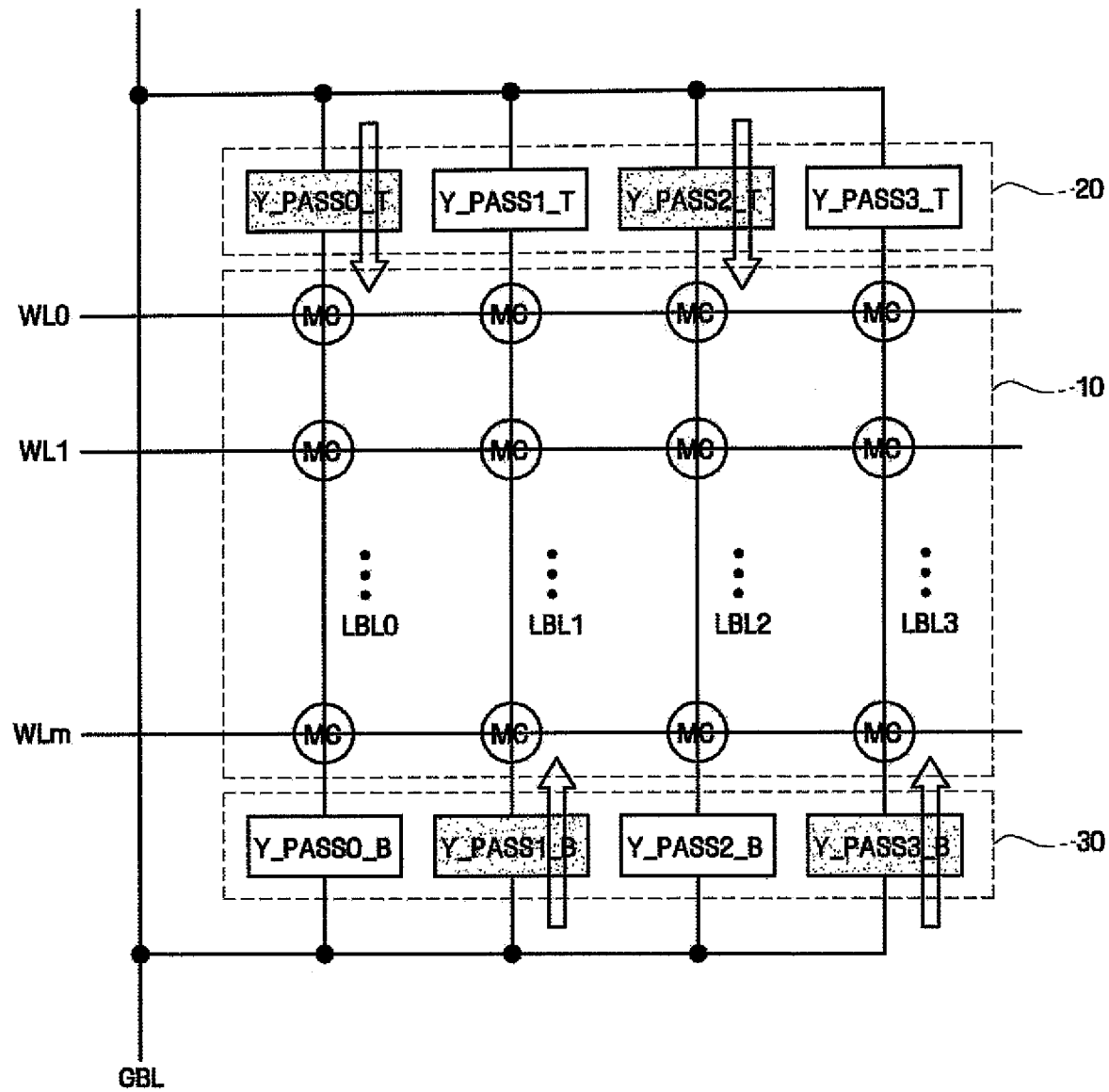
Figure 6A:
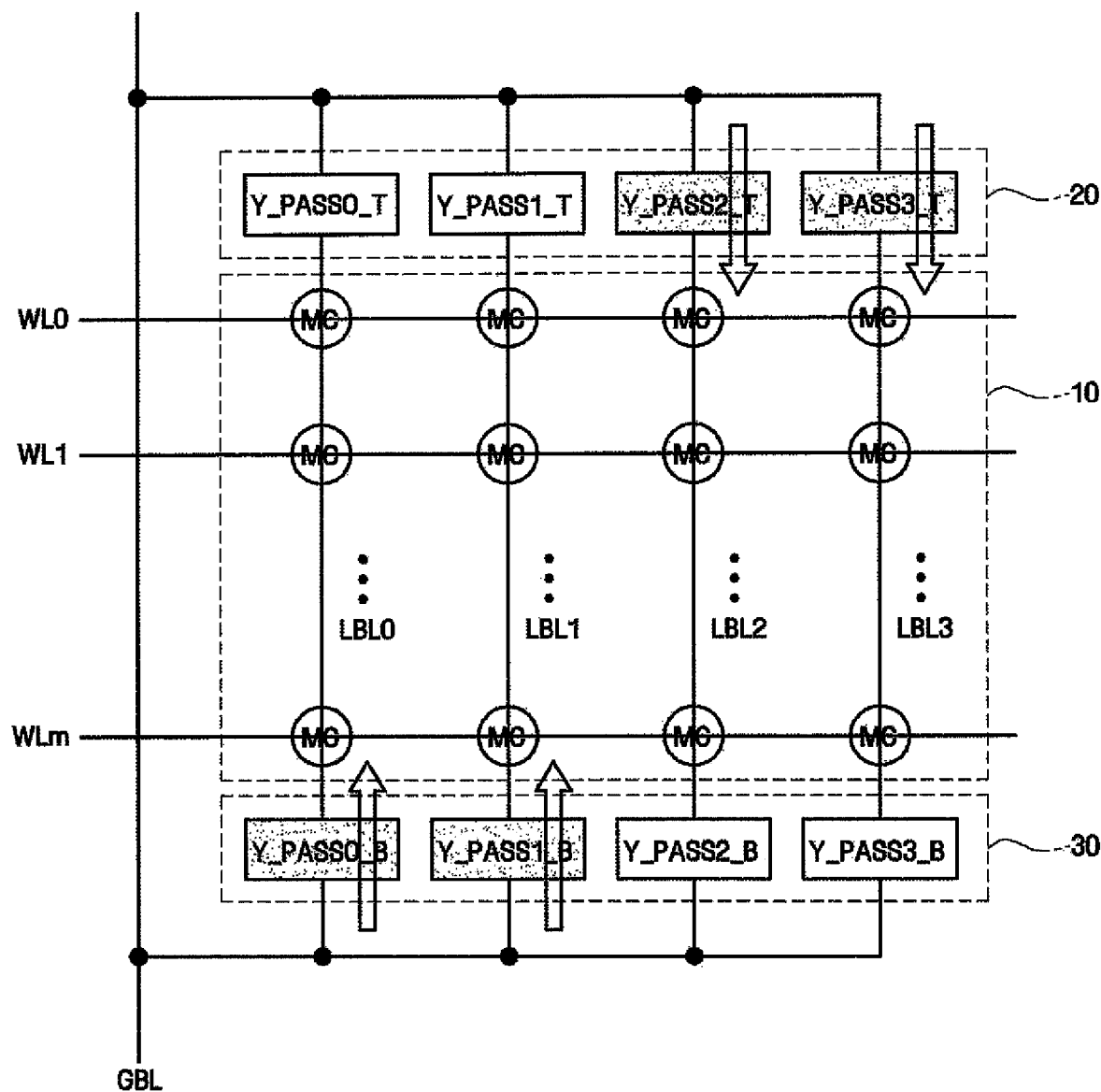
Figure 6B:
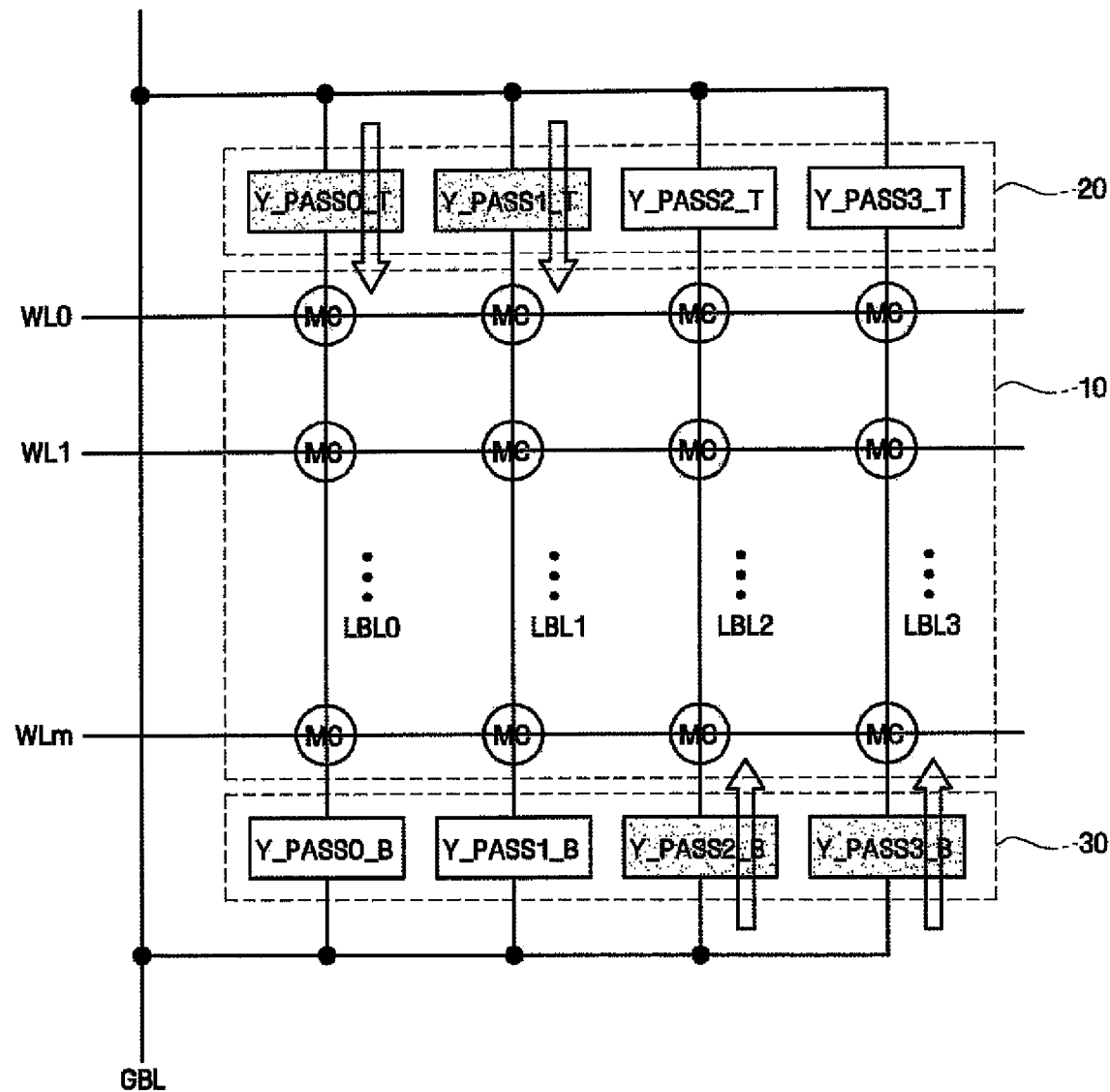

During a read operation, first bit line selection circuits Y_PASS0_T and Y_PASS2_T and second bit line selection circuits Y_PASS1_B and Y_PASS3_B operate as shown in FIG. 5B. Referring to FIG. 6A, during a read operation, first bit line selection circuits Y_PASS2_T and Y_PASS3_T and second bit line selection circuits Y_PASS0_B and Y_PASS1_B operate. Referring to FIG. 6B, during a read operation, first bit line selection circuits Y_PASS0_T and Y_PASS1_T and second bit line selection circuits Y_PASS2_B and Y_PASS3_B operate. The operation of the circuits shown in FIGS. 5B to 6B are similar to that shown in FIG. 5A and the associated description is omitted herein.

Figure 7A:
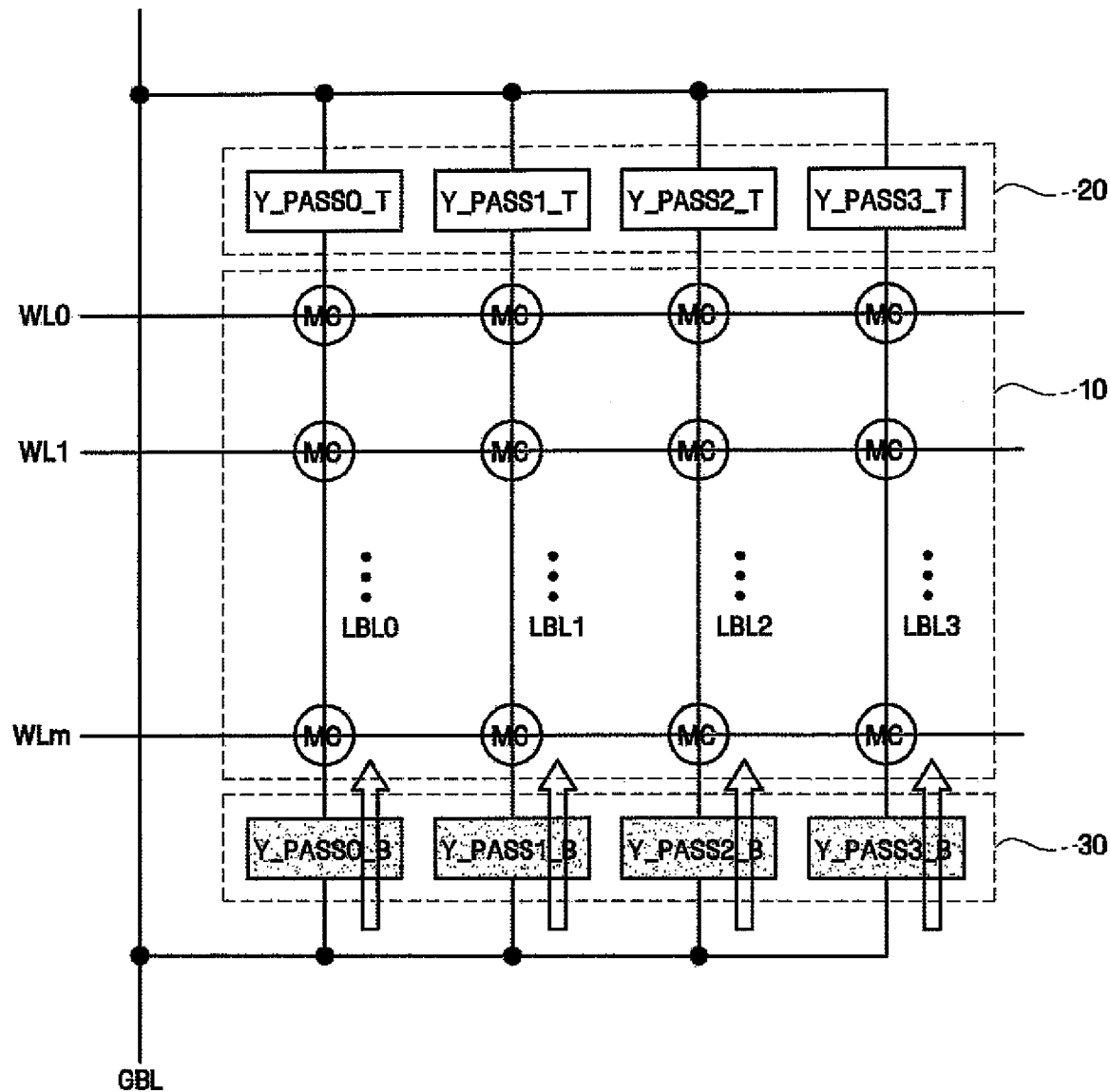
Figure 7B:
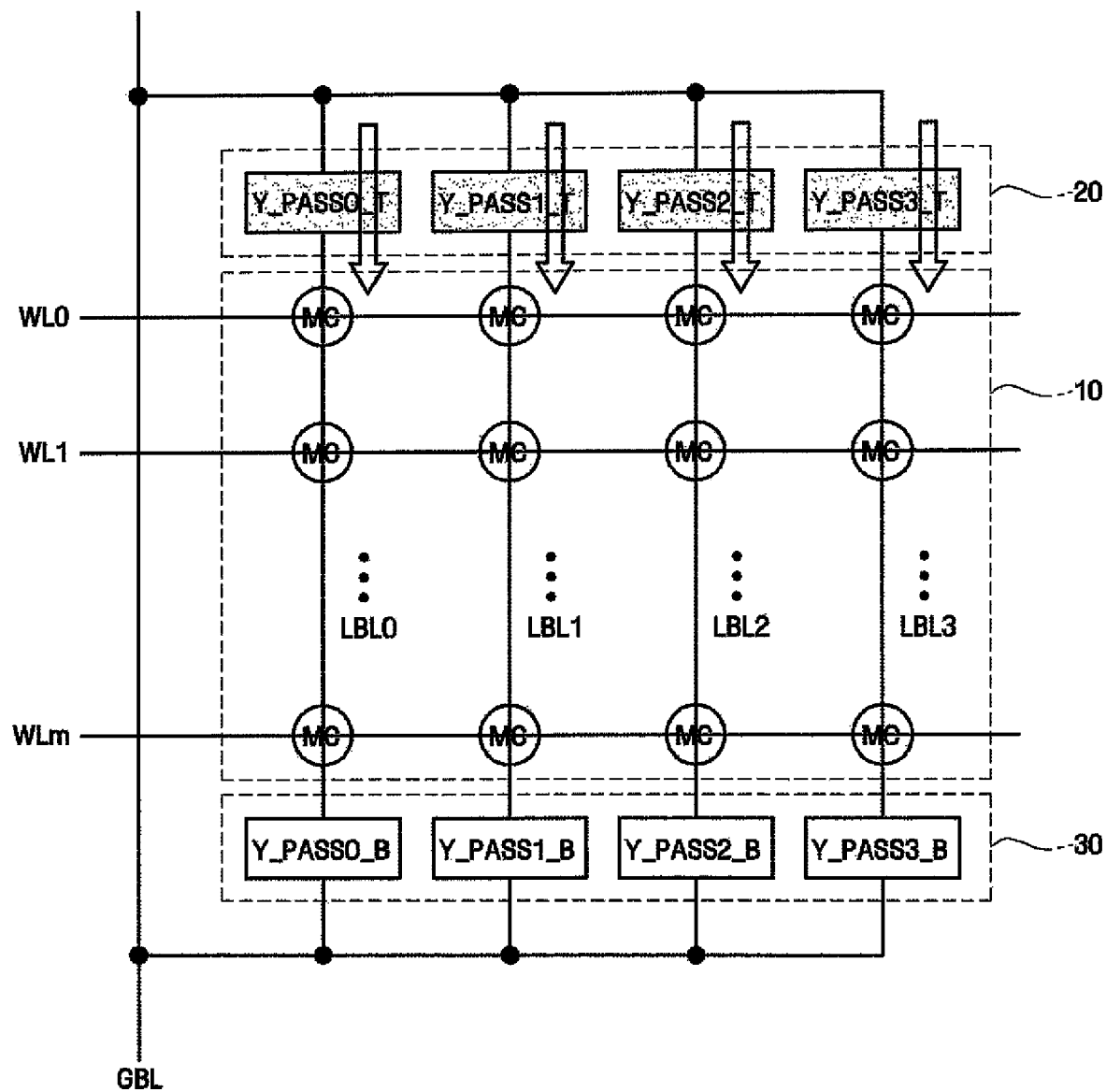

During a read operation as shown in FIGS. 7A to 7B, bit line selection circuits within any one of the first and second bit line selection blocks 20 and 30 operate while the bit line selection circuits within the other bit line selection block do not operate. Referring to FIG. 7A, second bit line selection circuits Y_PASS0_B to Y_PASS3_B within second bit line selection block 30 operate while first bit line selection circuits Y_PASS0_T to Y_PASS3_T within first bit line selection block 20 do not operate. Referring to FIG. 7B, first bit line selection circuits Y_PASS0_T to Y_PASS3_T within first bit line selection block 20 operate while second bit line selection circuits Y_PASS0_B to Y_PASS3_B within second bit line selection block 30 do not operate. During a burst read operation, a plurality of driving methods may be used from among the driving methods described with reference to FIGS. 5A and 7B. For example, upon a burst read operation, the bit line selection circuits may operate as shown in FIG. 5A for each odd-numbered read operation while the bit line selection circuits may operate as shown in FIG. 5B for each even-numbered read operation. The above embodiment of the present invention is described using an example in which the driving method of the first and second bit line selection circuits Y_PASS0_T to Y_PASS3_T and Y_PASS0_B to Y_PASS3_B is changed depending on whether a write operation or a read operation is to be performed. However, alternative configurations may be employed where the driving method of first and second bit line selection circuits Y_PASS0_T to Y_PASS3_T and Y_PASS0_B to Y_PASS3_B may be changed depending on time periods or intervals.

Figure 8:
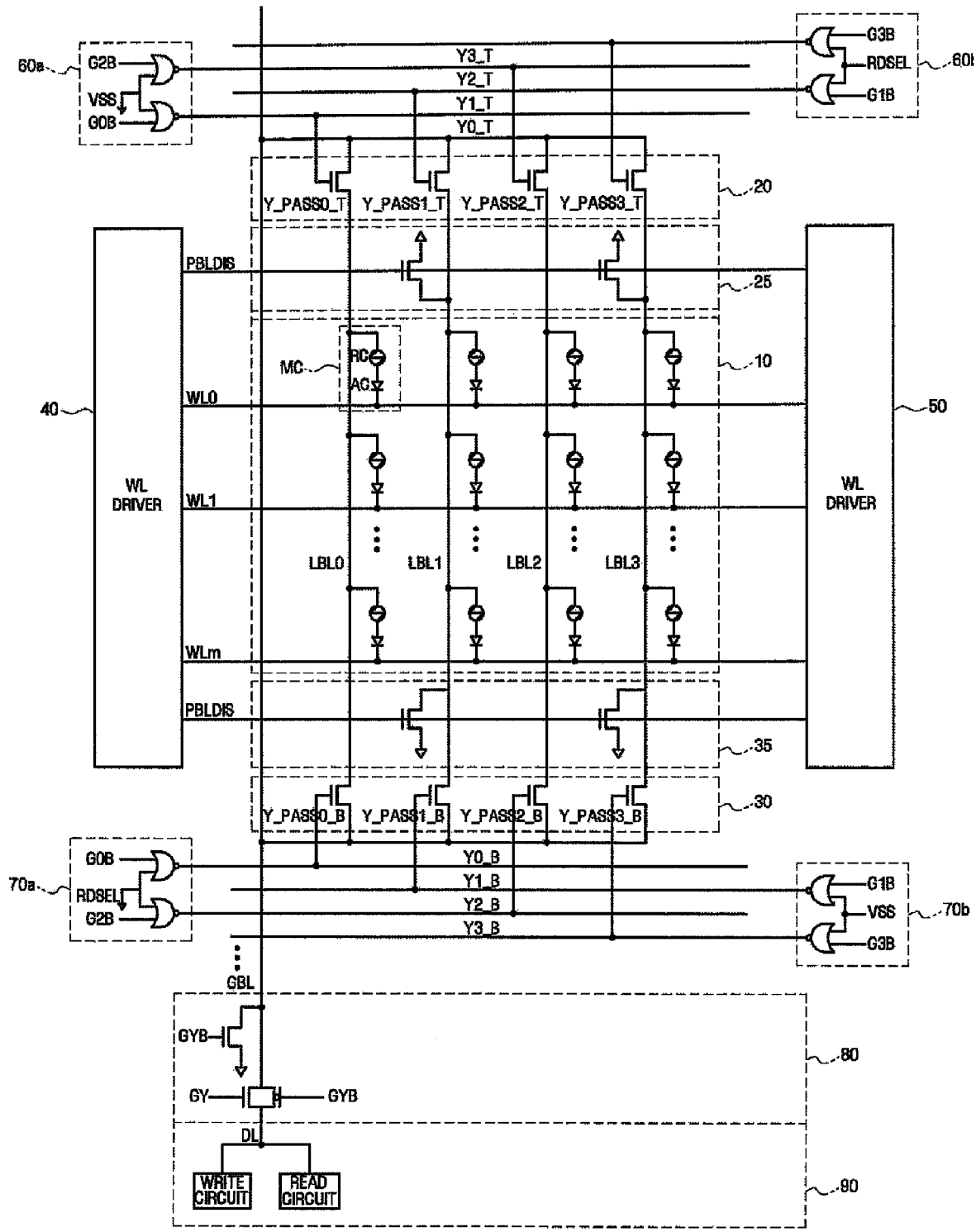
FIG. 8 is a circuit diagram illustrating the configuration of a nonvolatile memory device according to an exemplary embodiment of the present invention.

FIG. 8 is a circuit diagram illustrating the bit line selection circuits shown in FIG. 4 during a write operation and as shown in FIG. 5B during a read operation. The nonvolatile memory device includes a memory cell array 10, word lines WL0 to WLm, local bit lines LBL0 to LBL3, global bit line GBL, first bit line selection block 20, second bit line selection block 30, first bit line discharge block 25, a second bit line discharge block 35, word line driver blocks 40 and 50, first operation circuit 60A, 60B, second operation circuit 70A, 70B, global bit line selection block 80, and write/read circuit block 90.

First bit line discharge block 25 is disposed between memory cell array 10 and first bit line selection block 20. Second bit line discharge block 35 is disposed between memory cell array 10 and second bit line selection block 30. Global bit line selection block 80 and write/read circuit block 90 are disposed at the lower side of second bit line selection block 30. First operation circuit 60A, 60B provides first column selection signals Y0_T to Y3_T for operating first bit line selection circuits Y_PASS0_T to Y_PASS3_T to first bit line selection block 20. First operation circuit 60A, 60B may be divided into two circuits 60A and 60B. For example, as shown in FIG. 8, first operation circuit 60A provides first column selection signals Y0_T and Y2_T and is disposed above word line driver block 40. First operation circuit 60B provides first column selection signals Y1_T and Y3_T and may be disposed above word line driver blocks 50.

Second operation circuit 70A, 70B provides second column selection signals Y0_B to Y3_B to operate second bit line selection circuits Y_PASS0_B to Y_PASS3_B in second bit line selection block 30. Second operation circuit 70A, 70B may be divided into two circuits 70A and 70B. For example second operation circuit 70A provides second column selection signals Y0_B and Y2_B and is disposed at the lower side of second bit line selection block 30. Second operation circuit 70B provides second column selection signals Y1_B and Y3_B and is disposed at the lower side of second bit line selection block 30.

First operation circuit 60A includes NOR gates for receiving column address information G0B and G2B, and voltage signal VSS. First operation circuit 60A provides first column selection signals Y0_T and Y2_T. The first operation circuit 60B includes NOR gates for receiving column address information G1B and G3B and operation selection signal RDSEL. First operation circuit 60B provides first column selection signals Y1_T and Y3_T. The second operation circuit 70A includes NOR gates for receiving column address information G0B and G2B, and operation selection signal RDSEL. Second operation circuit 70A provides second column selection signals Y0_B and Y2_B. Second operation circuit 70B includes NOR gates for receiving column address information G1B and G3B, and voltage signal VSS. Second operation circuit 70B provides second column selection signals Y1_B and Y3_B. Column address information G0B to G3B may be provided by decoding a column address provided externally. Operation selection signal RDSEL is activated to a high level for a read operation and is deactivated to a low level for a write operation.

Figure 9A:
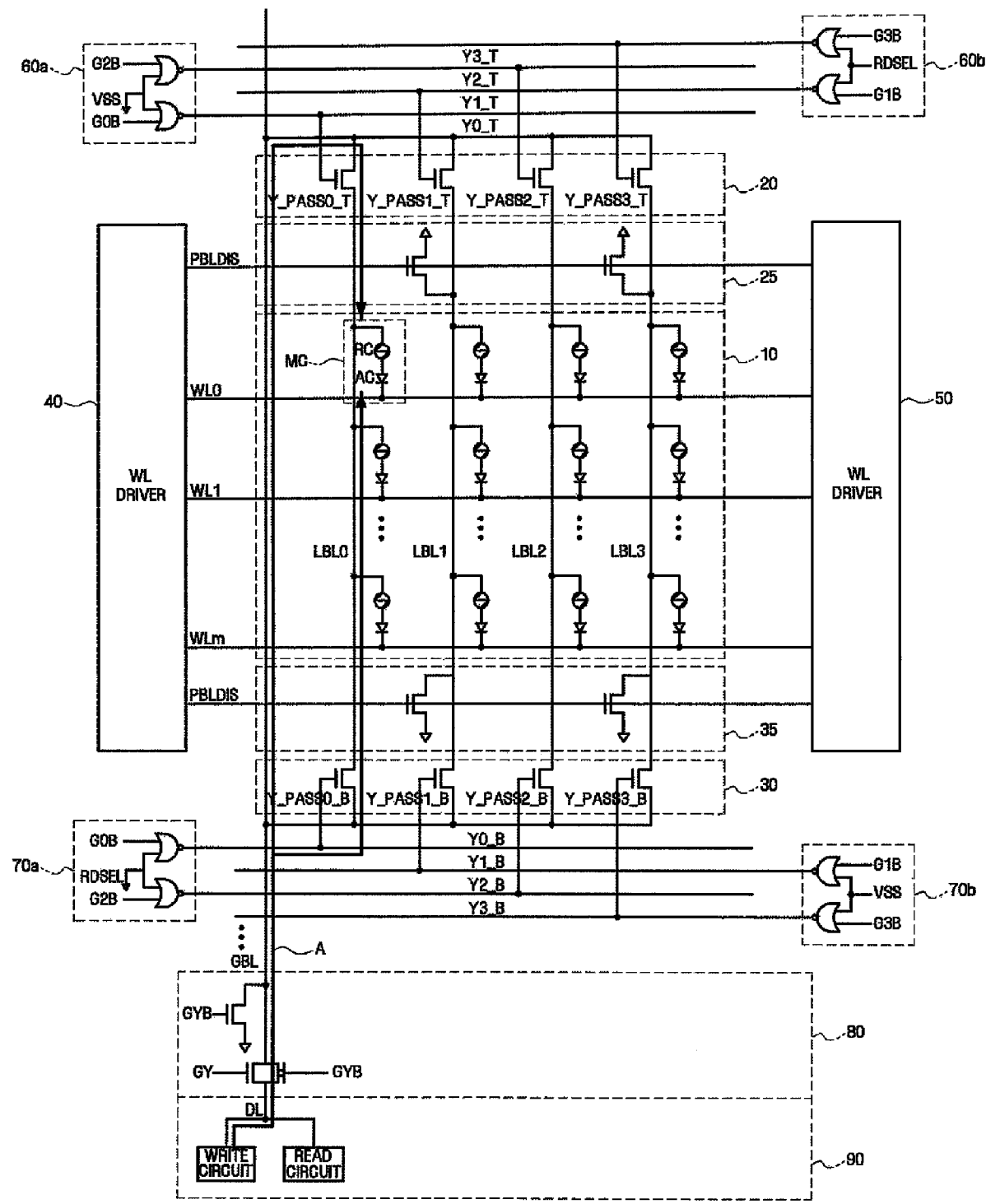

The operation of writing data on the nonvolatile memory cell "MC" coupled with word line WL0 and local bit line LBL0 will be described as an example with reference to FIGS. 9A and 9B. At time t1, discharge signal PBLDIS is shifted to a high level and first bit line discharge block 25 discharges bit line LBL0 to ground voltage level "VSS." At time t2, word line WL0 is selected by shifting to a low level. Since global bit line selection signal GY is shifted to a high level, global bit line selection block 80 selects global bit line GBL. In addition, since column address information G0B is shifted to a low level, and operation selection signal RDSEL is at a low level, first operation circuit 60A outputs first column selection signal Y0_T at a high level and second operation circuit 70A outputs second column selection signal Y0_B at a high level. Thus, both first bit line selection circuits Y_PASS0_T and second bit line selection circuit Y_PASS0_B operate in second bit line selection block 30.

In this manner, write current "A" is provided to nonvolatile memory cell "MC" coupled with word line WL0 and local bit line LBL0. Two current paths are available for the write current to flow to memory cell "MC" selected by the write circuit (see reference character "A"). That is, one current path of the write circuit is from data line DL to global bit line GBL to first bit line selection circuit Y_PASS0_T to local bit line LBL0 to word line WL0. Another current path of the write circuit is from the data line DL to global bit line GBL to second bit line selection circuit Y_PASS0_B to local bit line LBL0 to word line WL0. At time t3, word line WL0 is unselected by shifting to a high level, global bit line selection signal GY is shifted to a low level, and column address information G0B is shifted to a high level.

Figure 10A:
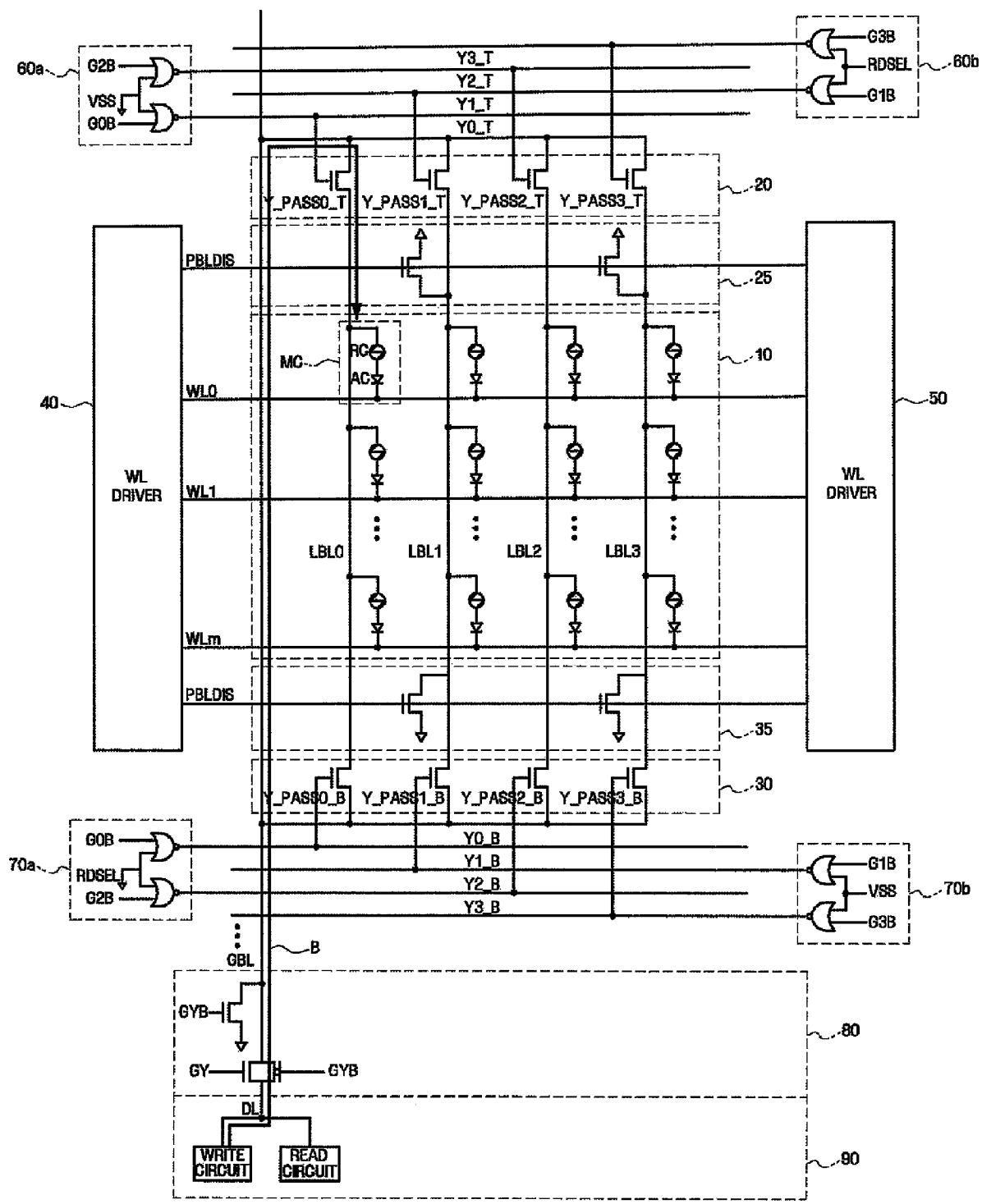
FIG. 10A to 10B are diagrams illustrating a reading method of the nonvolatile memory device according to an exemplary embodiment of the present invention.
Figure 10B:
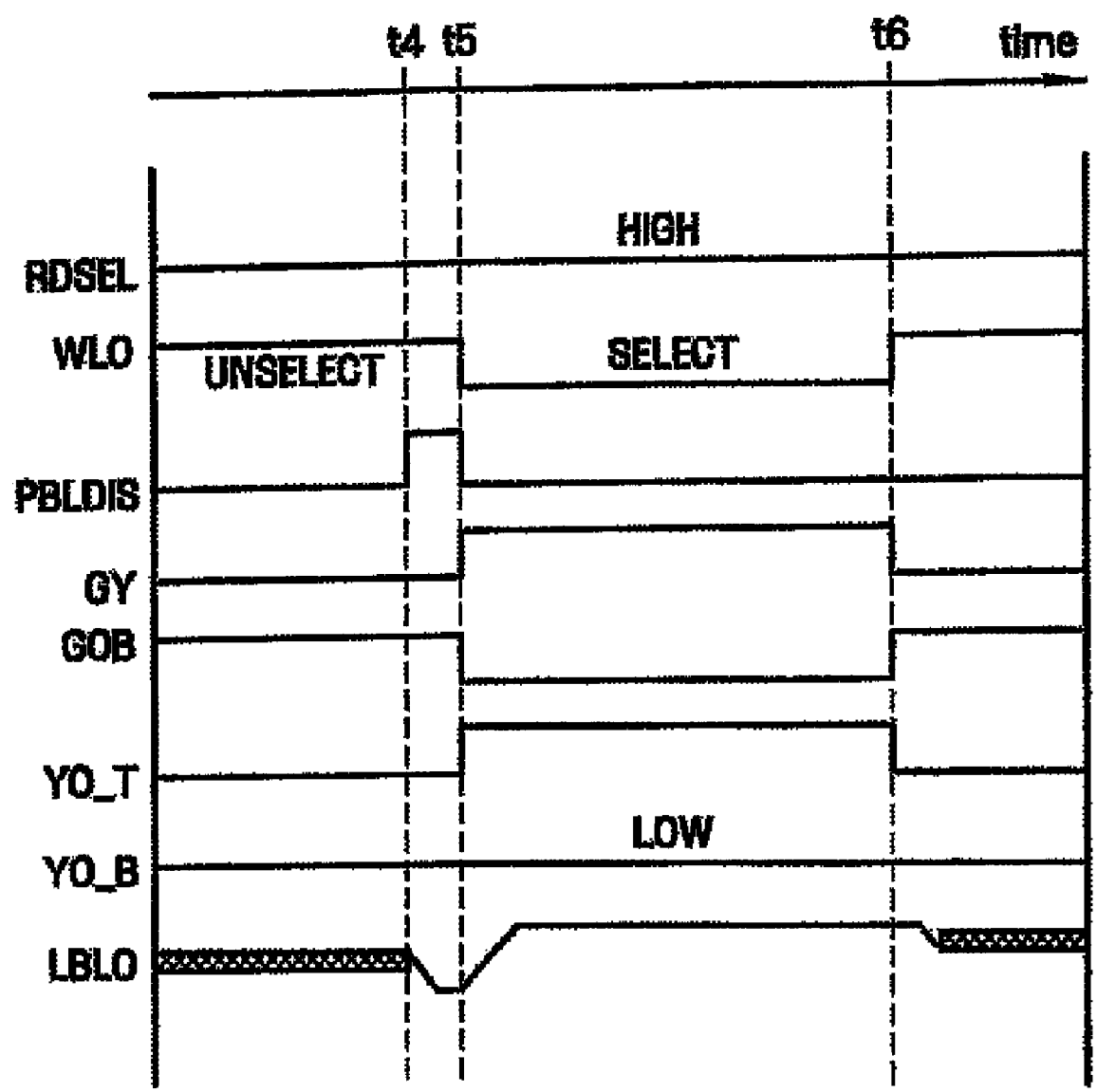

The operation of reading data from the nonvolatile memory cell "MC" coupled with the word line WL0 and the local bit line LBL0 will be described as an example with reference to FIGS. 10A and 10B. At time t4, discharge signal PBLDIS is shifted to a high level and first bit line discharge block 25 discharges bit line LBL0 to the ground voltage level "VSS." At time t5, word line WL0 is selected by shifting to a low level. Since global bit line selection signal GY is shifted to a high level, global bit line selection block 80 selects global bit line GBL. In addition, since column address information G0B is shifted to a low level and operation selection signal RDSEL is at a high level, first operation circuit 60A outputs a first column selection signal Y0_T at a high level and the second operation circuit 70A outputs second column selection signal Y0_B at a low level. Thus, first bit line selection circuit Y_PASS0_T operates and second bit line selection circuit Y_PASS0_B does not operate. Read current "B" is provided to selected memory cell "MC" coupled with word line WL0 and local bit line LBL0. In this case, one read current path to memory cell "MC" is selected by the read circuit (see reference character "B") from data line DL to global bit line GBL to first bit line selection circuit Y_PASS0_T to local bit line LBL0 to word line WL0. At time t6, word line WL0 is unselected by shifting to a high level, global bit line selection signal GY is shifted to a low level, and column address information G0B is also shifted to a high level.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A nonvolatile memory device comprising:
    a memory cell array having a plurality of nonvolatile memory cells;
    a bit line defined by a global bit line coupled and a local bit line coupled to a plurality of said nonvolatile memory cells having first and second nodes; and
    first and second bit line selection circuits, the first bit line selection circuit coupled to the first node of the local bit line and the second bit line selection circuit coupled to the second node of the local bit line, wherein the first and second bit line selection circuits operate during a first period to electrically connect the local bit line to the global bit line, and only one of the first and second bit line selection circuits operates during a second period to electrically connect the local bit line to the global bit line.

2. The nonvolatile memory device of claim 1, wherein data is written on a nonvolatile memory cell selected from among the plurality of nonvolatile memory cells coupled to the local bit line during the first period.

3. The nonvolatile memory device of claim 1, wherein data is read from a nonvolatile memory cell selected from among the plurality of nonvolatile memory cells coupled to the local bit line during the second period.

4. The nonvolatile memory device of claim 1 further comprising:
    a first operation circuit coupled to said first bit line selection circuit, said first operation circuit configured to supply a first column selection signal to operate the first bit line selection circuit; and
    a second operation circuit coupled to said second bit line selection circuit, said second operation circuit configured to supply a second column selection signal to operate the second bit line selection circuit.

5. The nonvolatile memory device of claim 1, wherein each of the nonvolatile memory cells comprises a phase-change memory cell.

6. A nonvolatile memory device comprising:
    a memory cell array comprising a matrix of rows and columns of nonvolatile memory cells, said array defined by a plurality of word lines where each word line is coupled to one of the columns of nonvolatile memory cells and local bit lines where each local bit line is coupled to each row of nonvolatile memory cells;
    a first word line driver block disposed at a first side of the memory cell array;
    a second word line driver block disposed at a second side of the memory cell array; and
    first and second bit line selection blocks disposed at third and fourth sides of the memory cell array, respectively, the first bit line selection block having first bit line selection circuits coupled to each of the local bit lines, and the second bit line selection block comprising second bit line selection circuits coupled to each of the local bit lines, wherein the first and second bit line selection circuits is coupled with a first local bit line selected from among the local bit lines to operate during a first period to electrically connect the selected first local bit line to a global bit line, and only one of the first and second bit line selection circuits coupled with a second local bit line selected from among the local bit lines to operate during a second period to electrically connect the selected second local bit line to the global bit line.

7. The nonvolatile memory device of claim 6, wherein data is written, during the first period, on a nonvolatile memory cell selected from among the nonvolatile memory cells coupled to the selected first local bit line.

8. The nonvolatile memory device of claim 6, wherein data is read, during the second period, from a nonvolatile memory cell selected from among the nonvolatile memory cells coupled to the selected second local bit line.

9. The nonvolatile memory device of claim 6, wherein certain bit line selection circuits in each of the bit line selection blocks operate during the first and second periods, and the other bit line selection circuits in each of the bit line selection blocks operate only during the first period.

10. The nonvolatile memory device of claim 9, wherein least one bit line selection circuit operating during the first and second periods and is provided on at least one side of a bit line selection circuit operating only during the first period.

11. The nonvolatile memory device of claim 6, wherein the bit line selection circuits within one of the bit line selection blocks operates during the first and second periods, and the bit line selection circuits within the other of the bit line selection blocks operates only during the first period.

12. The nonvolatile memory device of claim 6, further comprising:
    a first operation circuit coupled to said first bit line selection circuit, said first operation circuit configured to supply first column selection signals to operate the first bit line selection circuits; and
    a second operation circuit coupled to said second bit line selection circuit, said second operation circuit configured to supply second column selection signals to operate the second bit line selection circuits.

13. The nonvolatile memory device of claim 6, further comprising:

a first bit line discharge block disposed between the memory cell array and the first bit line selection block to discharge the local bit line; and a second bit line discharge block disposed between the memory cell array and the second bit line selection block to discharge the local bit line.

14. The nonvolatile memory device of claim 6, wherein the nonvolatile memory cell comprises a phase-change memory cell.

15. A nonvolatile memory device comprising:

a bit line coupled to a plurality of nonvolatile memory cells;

a write circuit coupled to the bit line, said write circuit configured to provide a write current to a nonvolatile memory cell selected from among the plurality of nonvolatile memory cells during a write period; and a read circuit coupled to the bit line, the read circuit configured to provide a read current to one of the plurality of nonvolatile memory cells selected during a read period, wherein a number of current paths for flow of the write current from the write circuit to the selected nonvolatile memory cell is N where N is a natural number, and a number of current paths for the flow of the read current from the read circuit to the selected nonvolatile memory cell is M where M is a natural number less than N.

16. The nonvolatile memory device of claim 15, wherein N=2 and M=1.

17. The nonvolatile memory device of claim 15, wherein the bit line comprises a local bit line and a global bit line, the local bit line is coupled to the nonvolatile memory cells and the global bit line is coupled to the write circuit and the read circuit, the nonvolatile memory device further comprising:

a first bit line selection circuit and a second bit line selection circuit, the first bit line selection circuit coupled between a first node of the local bit line and the global bit line, the second bit line selection circuit coupled between a second node of the local bit line and the global bit line, wherein the first and second bit line selection circuits operate during the write period to electrically connect the local bit line and the global bit line, and only one of the first and second bit line selection circuits operates during the read period to electrically connect the local bit line and the global bit line.

18. A driving method of a nonvolatile memory device comprising:

providing a nonvolatile memory device having a local bit line coupled to a plurality of nonvolatile memory cells, a first bit line selection circuit coupled with a first node of the local bit line, and a second bit line selection circuit coupled with a second node of the local bit line;

operating the first and second bit line selection circuits during a first period to electrically connect the local bit line and a global bit line; and operating only one of the first and second bit line selection circuits during a second period to electrically connect the local bit line and the global bit line.

19. The method of claim 18, wherein data is written, during the first period, on a nonvolatile memory cell selected from among the nonvolatile memory cells coupled to the local bit line.

20. The method of claim 18, wherein data is read, during the second period, from a nonvolatile memory cell selected from among the nonvolatile memory cells coupled to the local bit line.

* * * * *